United States Patent
Chang et al.

(10) Patent No.: US 7,590,507 B2
(45) Date of Patent: Sep. 15, 2009

(54) STRUCTURE AND METHOD FOR MONITORING VARIATION WITHIN AN ACTIVE REGION OF A SEMICONDUCTOR DEVICE USING SCALING

(75) Inventors: William Y. Chang, Williston, VT (US); Sharon L. Von Bruns, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 194 days.

(21) Appl. No.: 11/749,801

(22) Filed: May 17, 2007

(65) Prior Publication Data

US 2008/0288188 A1 Nov. 20, 2008

(51) Int. Cl.
*G06F 17/18* (2006.01)
(52) U.S. Cl. .................................................. 702/179
(58) Field of Classification Search ................ 702/179, 702/188; 324/76.11, 765; 438/14, 15
See application file for complete search history.

(56) References Cited

U.S. PATENT DOCUMENTS

| | | | |
|---|---|---|---|
| 6,800,494 B1 * | 10/2004 | Castle et al. ................ | 438/14 |
| 6,922,641 B2 | 7/2005 | Batzinger et al. | |
| 2005/0043908 A1 | 2/2005 | Bhavnagarwala et al. | |
| 2007/0145998 A1 * | 6/2007 | Smayling et al. ............ | 324/765 |

* cited by examiner

*Primary Examiner*—Bryan Bui
(74) *Attorney, Agent, or Firm*—Downs Rachlin Martin PLLC (57) ABSTRACT

A semiconductor wafer is provided with one or more parameter scaling metric (PSM) groupings. Each PSM grouping includes a first device having a known active region geometry and further includes a set of one or more devices having active region geometry dimensions in a known relationship with the active region geometry of the first device. One or more parameter scaling metrics are calculated using measured values of one or more active region parameters of interest. The parameter scaling metric(s) can be used to quantify the stability and uniformity of a fabrication process used to make the semiconductor wafer.

20 Claims, 4 Drawing Sheets

Scaling Tables

Wafer: VU4WWIP | Site: 5.4 | Device Type: hp | Code Version: New | Update

• Scaling

| Device | Ic | Ib | Scaling | Ic Scaling | Ib Scaling | Beta Scaling | Ic Scaling metric | Ib Scaling metric |
|---|---|---|---|---|---|---|---|---|
| 0.24x0.72x1 | 1.0146e-6 | 3.8316e-9 | 0.09 | 0.06 | 0.03 | 1.75 | | |
| 0.24x1.06x1 | 1.6960e-6 | 6.0797e-9 | 0.13 | 0.10 | 0.05 | 1.85 | 1.14e-1 | 2.05e+0 |
| 0.24x2.10x1 | 3.2402e-6 | 1.3332e-8 | 0.25 | 0.18 | 0.11 | 1.61 | 1.34e-1 | 1.43e+0 |
| 0.24x4.20x1 | 7.6075e-6 | 3.9016e-8 | 0.50 | 0.43 | 0.33 | 1.29 | 4.83e-2 | 3.49e-1 |
| 0.24x8.40x1 | 1.4987e-5 | 9.0873e-8 | 1.00 | 0.85 | 0.78 | 1.09 | 3.27e-2 | 1.03e-1 |
| 0.24x16.80x1 | 2.6225e-5 | 1.5590e-7 | 2.00 | 1.48 | 1.33 | 1.11 | 1.42e-1 | 2.78e-1 |
| 0.48x1.44x1 | 6.7755e-6 | 3.9840e-8 | 0.34 | 0.38 | 0.34 | 1.12 | | |
| 0.48x2.10x1 | 9.3494e-6 | 6.1200e-8 | 0.50 | 0.53 | 0.52 | 1.01 | 6.17e-3 | 4.52e-3 |
| 0.48x4.20x1 | 1.7686e-5 | 1.1699e-7 | 1.00 | 1.00 | 1.00 | 1.00 | 3.28e-3 | 2.14e-3 |
| 0.48x8.40x1 | 2.9214e-5 | 2.0244e-7 | 2.00 | 1.65 | 1.73 | 0.95 | 8.89e-2 | 4.85e-2 |
| 0.48x16.80x1 | 6.3284e-5 | 5.0256e-7 | 4.00 | 3.58 | 4.30 | 0.83 | 1.98e-2 | 4.25e-2 |
| 0.24x4.20x2 | 1.7014e-5 | 1.0334e-7 | 1.00 | 0.96 | 0.88 | 1.09 | 1.27e-2 | 7.74e-2 |
| 0.24x8.40x2 | 2.9631e-5 | 1.8223e-7 | 2.00 | 1.68 | 1.56 | 1.08 | 5.96e-2 | 9.86e-2 |
| 0.24x16.80x2 | 4.6333e-5 | 2.7297e-7 | 4.00 | 2.62 | 2.33 | 1.12 | 3.55e-1 | 6.23e-1 |
| 0.48x4.20x2 | 3.6508e-5 | 2.5908e-7 | 2.00 | 2.06 | 2.21 | 0.93 | 1.94e-3 | 1.88e-2 |
| 0.48x8.40x2 | 6.1239e-5 | 4.4412e-7 | 4.00 | 3.46 | 3.80 | 0.91 | 6.11e-2 | 3.07e-2 |
| 0.48x16.80x2 | 1.1107e-4 | 8.2119e-7 | 8.00 | 6.28 | 7.02 | 0.89 | 8.56e-2 | 2.62e-2 |
| | | | | | | | 1.17 | 5.18 |

Scaling Tables

Wafer: V24X1PP | Site: 5.4 | Device Type: hp | Code Version: New | Update

• Scaling

| Device | Ic | Ib | Scaling | Ic Scaling | Ib Scaling | Beta Scaling | Ic Scaling metric | Ib Scaling metric |
|---|---|---|---|---|---|---|---|---|
| 0.24x0.72x1 | 9.2347e-7 | 4.0507e-9 | 0.09 | 0.12 | 0.08 | 1.45 | | |
| 0.24x1.06x1 | 1.4252e-6 | 6.6771e-9 | 0.13 | 0.19 | 0.14 | 1.36 | 1.09e-1 | 1.87e-2 |
| 0.24x2.10x1 | 2.6244e-6 | 1.3673e-8 | 0.25 | 0.35 | 0.28 | 1.22 | 8.22e-2 | 1.43e-2 |
| 0.24x4.20x1 | 4.3648e-6 | 2.8305e-8 | 0.50 | 0.57 | 0.58 | 0.98 | 5.79e-2 | 2.22e-2 |
| 0.24x8.40x1 | 7.9253e-6 | 5.6925e-8 | 1.00 | 1.04 | 1.18 | 0.89 | 1.20e-2 | 2.25e-2 |
| 0.24x16.80x1 | 1.5021e-5 | 1.1764e-7 | 2.00 | 1.98 | 2.43 | 0.81 | 3.18e-3 | 3.25e-2 |
| 0.48x1.44x1 | 3.4863e-6 | 1.6930e-8 | 0.34 | 0.46 | 0.35 | 1.31 | | |
| 0.48x2.10x1 | 4.5292e-6 | 2.4172e-8 | 0.50 | 0.60 | 0.50 | 1.19 | 4.11e-2 | 4.59e-4 |
| 0.48x4.20x1 | 7.5961e-6 | 4.8389e-8 | 1.00 | 1.00 | 1.00 | 1.00 | 3.71e-2 | 8.65e-7 |
| 0.48x8.40x1 | 1.3171e-5 | 9.2828e-8 | 2.00 | 1.73 | 1.92 | 0.90 | 4.71e-2 | 3.62e-3 |
| 0.48x16.80x1 | 2.4726e-5 | 1.8694e-7 | 4.00 | 3.26 | 3.86 | 0.84 | 5.66e-2 | 1.30e-3 |
| 0.24x4.20x2 | 9.2105e-6 | 5.6029e-8 | 1.00 | 1.21 | 1.16 | 1.05 | 3.34e-2 | 1.87e-2 |
| 0.24x8.40x2 | 1.6414e-5 | 1.1136e-7 | 2.00 | 2.16 | 2.30 | 0.94 | 2.05e-2 | 1.72e-2 |
| 0.24x16.80x2 | 3.0678e-5 | 2.2135e-7 | 4.00 | 4.04 | 4.57 | 0.88 | 5.00e-3 | 1.58e-2 |
| 0.48x4.20x2 | 1.5455e-5 | 9.3008e-8 | 2.00 | 2.03 | 1.92 | 1.06 | 5.78e-4 | 3.29e-3 |
| 0.48x8.40x2 | 2.7319e-5 | 1.8501e-7 | 4.00 | 3.60 | 3.82 | 0.94 | 2.99e-2 | 2.16e-3 |
| 0.48x16.80x2 | 5.0550e-5 | 3.6841e-7 | 8.00 | 6.65 | 7.61 | 0.87 | 4.74e-2 | 2.60e-3 |
| | | | | | | | 0.58 | 0.18 |

FIG. 5

STRUCTURE AND METHOD FOR MONITORING VARIATION WITHIN AN ACTIVE REGION OF A SEMICONDUCTOR DEVICE USING SCALING

FIELD OF THE INVENTION

The present invention generally relates to the field of semiconductor fabrication process variation monitoring. In particular, the present invention is directed to a structure and method for monitoring variation within an active region of a semiconductor device using scaling.

BACKGROUND

An important aspect of semiconductor wafer fabrication is the monitoring of the fabrication processes to determine whether or not they are functioning properly and/or calibrated properly so that the electronic devices being fabricated by the processes are being made to design specifications. A number of monitoring schemes have been implemented in the past, including the monitoring of site-to-site variation in a measured parameter of a device having a single active region geometry. However, this method has failed to capture subtle and emerging problems in a fabrication process that result from process development changes, process drift and process variation, and has resulted in large yield loss, delay in technology qualification and unproductive use of engineering resources. A sensitive monitor is needed to help in the early detection of factors affecting the uniformity and stability of a device fabrication process, including geometry-dependent process effects such as stress effects, implant scattering effects, dislocation defects, and residuals. Further, a monitor that provides a means to electrically characterize process changes and process improvements is of value in the field of semiconductor fabrication.

SUMMARY OF THE DISCLOSURE

In one embodiment, a method of monitoring variation in a process is provided. The method includes providing at least one grouping of devices on at least one semiconductor article, each of the at least one grouping including: a first device having a known active region geometry and at least one first key terminal; and a set of one or more second devices each having active region geometry dimensions in a known relationship with the known active region geometry of the first device and including at least one second key terminal; measuring an active region parameter for each of the devices in each of the at least one grouping of devices; calculating a parameter scaling metric for each grouping of the at least one grouping; and using the parameter scaling metric to assess process variation.

In another embodiment, a semiconductor wafer is provided. The wafer includes a plurality of layers, at least one parameter scaling metric grouping of devices formed amongst the plurality of layers, each of the at least one parameter scaling metric grouping including: a first device having a known active region geometry and at least one first key terminal; and a set of one or more second devices each having active region geometry dimensions in a known relationship with the known active region geometry of the first device and including at least one second key terminal; circuitry for contacting corresponding respective ones of the at least one first key terminal and the at least one second key terminal so as to measure an active region parameter for each one of the devices.

In still another embodiment, a machine readable medium is provided. The medium includes storing computer executable instructions for monitoring variation in a process of a semiconductor device using parameter measurement data acquired from at least one parameter scaling metric grouping of fabricated semiconductor devices, wherein the grouping includes a first device having a known active region geometry and further includes a set of one or more second devices each having active region geometry dimensions in a known relationship with the known active region geometry of the first device, the computer executable instructions comprising: a first set of machine executable instructions for receiving parameter measurement data for the fabricated semiconductor devices in the at least one grouping; a second set of machine executable instructions that calculates at least one parameter scaling metric for each grouping of the at least one grouping as a function of the parameter measurement data; and a third set of machine executable instructions for displaying the at least one parameter scaling metric to a user.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Figure 1:
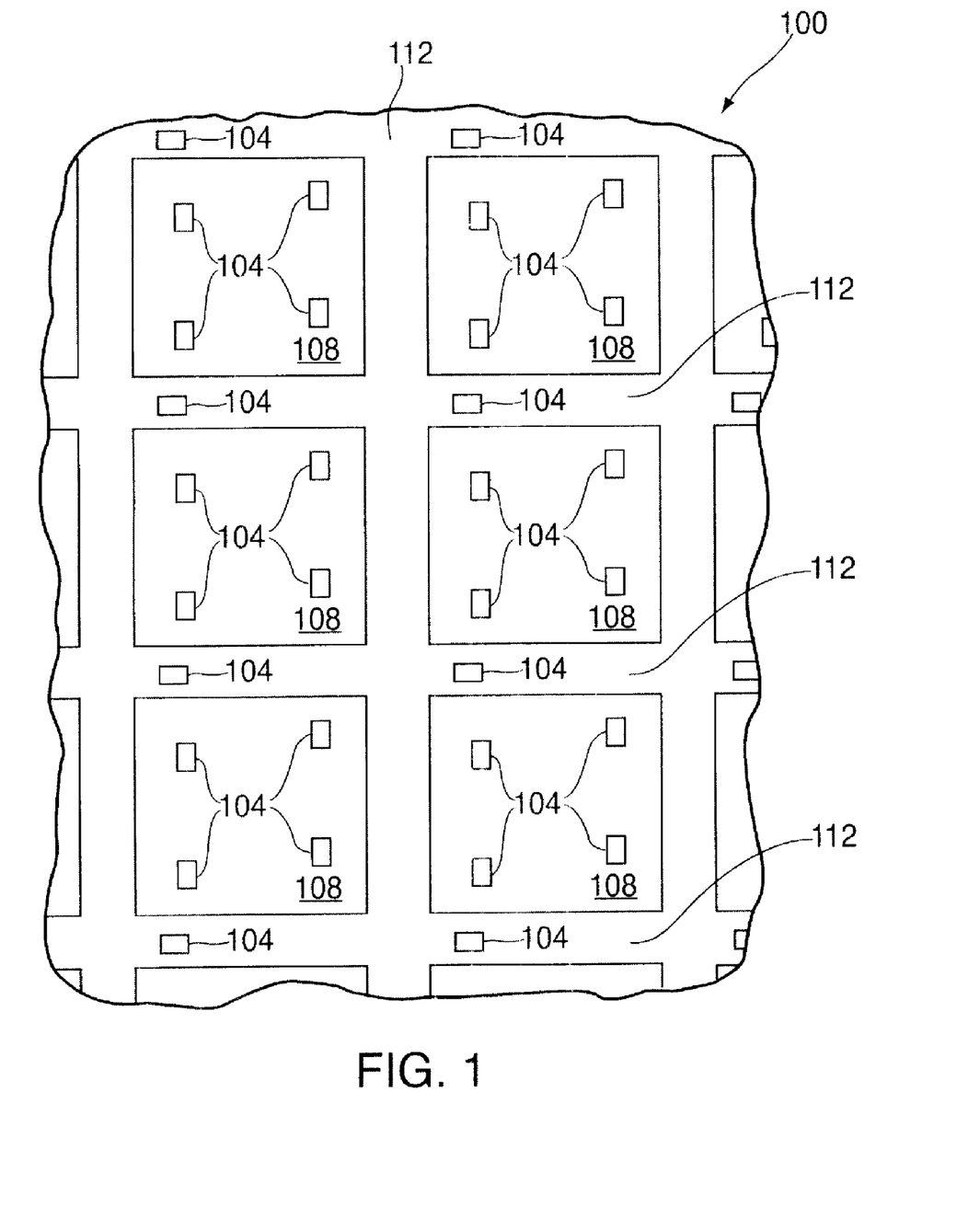
FIG. 1 is a partial top view of a semiconductor wafer that includes a plurality of scaling metric groupings of devices in accordance with the present invention.
Figure 2:
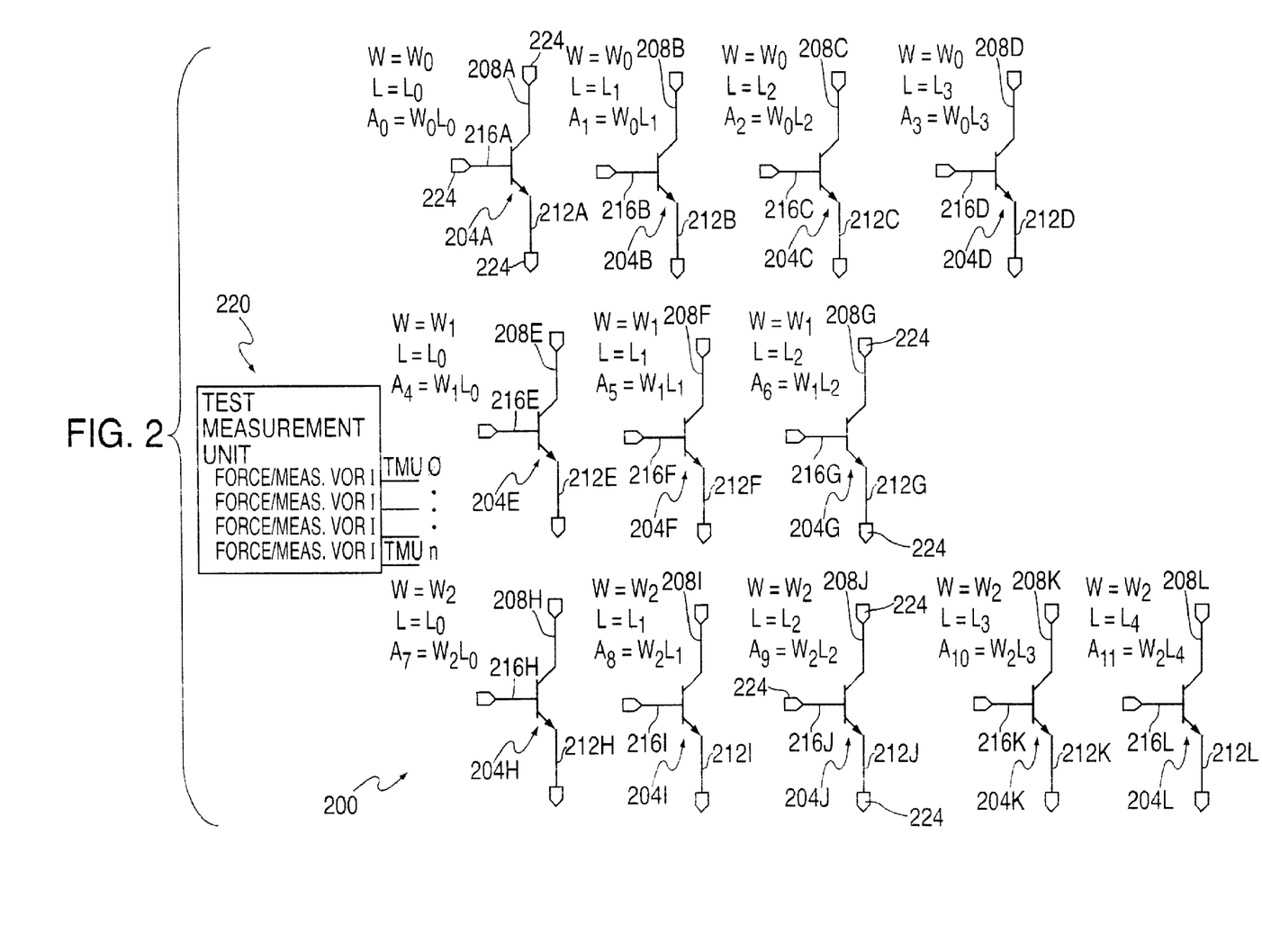
FIG. 2 is a schematic diagram of an exemplary scaling metric grouping that may be used for any one or more of the scaling metric groupings of FIG. 1.

Referring now to the drawings, FIG. 1 illustrates a semiconductor wafer 100 that includes a plurality of parameter scaling metric (PSM) groupings 104 of test devices (not shown, but see, e.g., devices 204A-L of FIG. 2). As will be described below in greater detail, the devices within each PSM grouping 104 are devices that have active regions of known geometry and that are of the same type. Examples of devices suitable for use in a PSM grouping, such as any one or more of PSM groupings 104, include devices having bipolar junctions (e.g., transistors, emissive devices, diodes), field effect transistors (FETs), resistors, capacitors and inductors, among others. At a high level, locating one or more PSM groupings on a single wafer (such as seen with PSM groupings 104 on wafer 100 of FIG. 1) and/or across multiple wafers, allows one or more parameter scaling metrics to be calculated for the as-fabricated wafers. As described below, PSM groupings 104 may be located virtually anywhere on wafer 100 desired, such as within die regions 108 or within kerf regions 112. The calculated parameter scaling metric(s) may be used, e.g., as a sensitive monitor to assess the variability in a process across a region of a wafer, an entire wafer and/or across a number of wafers and as a basis for guaranteeing scalability of devices and hardware-to-model integrity to customers. Parameter scaling metric analysis in accordance with the present disclosure may be used in the identification and characterization of process problems and geometry-dependent process effects, may be used as a means for evaluating process improvements, and may be used to provide information in evaluating the stability and uniformity of a process. Benefits of performing a parameter scaling metric analysis in accordance with the present disclosure include reduced yield loss, reduced delay in technology qualification and reduced wasting of engineering resources, which result from early problem detection.

As will become apparent from the following description, the term "parameter scaling metric" and like terms are used herein and in the appended claims to indicate a calculated metric that is based on parameter scaling. In the context of the present disclosure, including the appended claims, "parameter scaling" is the relationship between a measured parameter for two devices that differ only in the geometry of their active regions. This can be expressed as:

$$X_{scaling} = X_i / X_{ref} \quad \{1\}$$

where Xscaling is a scaling factor for a given parameter, Xref is the value of the parameter for a reference device having a first active region geometry and Xi is the value of the parameter for a target device being compared to the reference device. For example, for a device that is an NPN Heterojunction Bipolar Transistor (HBT), a parameter of interest may be the base current. In this example, the fabrication process is such that if the emitter area of the target device is double the emitter area of the reference device, then the base current is expected to be double, resulting in a base current scaling factor of 2. Written in the format above, $$Ib_{scaling} = Ib_i / Ib_{ref} \quad \{2\}$$

where $Ib_{scaling}$ is the measured base current scaling factor for a particular pair of NPN devices, $Ib_{ref}$ is the measured base current for a reference NPN device and $Ib_i$ is the measured base current for a target NPN device.

Compact models for bipolar, FET, resistor, capacitor and inductor devices use the scalability of the subject device's active region to efficiently model its behavior. For example, a single model can describe the behavior of many different layouts of an n-type FET (nFET) device. During simulation, the nFET model is provided with the specific values for the geometric aspects of the nFET device under consideration, such as gate width, gate length and number of fingers. With these inputs, the equations of the model calculate the appropriate device active regions (eg. pertinent areas, perimeters, distances, etc.) and then calculate the various parameters that describe the behavior of the nFET device under consideration.

Referring now to FIG. 2, and also to FIG. 1, FIG. 2 illustrates an example 200 of a grouping that may be used for each of one, some or all of groupings 104 of FIG. 1. In this example, grouping 200 contains a plurality of HBTs 204A-L. Although HBTs 204A-L with emitter areas $A_0$-$A_{11}$ are used in this example, those skilled in the art will readily appreciate that any other suitable devices with active regions that can be described with geometric properties such as length, width, area, perimeter, number of fingers, number of layers, number of turns, number of sides, height, distance, and/or thickness, etc., such as the devices mentioned above, may be provided, depending on a particular application. Generally, grouping 200 may be created by selecting a first device, such as HBT 204A, having an active region of a known geometry and then adding one or more additional devices, here HBTs 204B-L, having active region geometries in a known ratio (including a ratio of 1, i.e., "mismatch") with respect to the first device and that are located in proximity to the first device. When fabricated, devices of a grouping may be abutting or they may be several hundred microns apart center-to-center, or they may be one or more millimeters apart center-to-center, depending on the size and number of the devices and the ability to wire them up for measurement.

In the present example, grouping 200 contains twelve NPN HBTs 204A-L arranged in rows and columns according to the widths W and lengths L of the active regions of the HBTs for the purposes of convenient schematic representation, and may be fabricated in a different arrangement, eg., with the first device centrally located with respect to the other devices in the grouping, etc. In this arrangement, the widths W are held constant across each row and the lengths are held constant through each column. As those skilled in the art will readily appreciate, this example with HBTs 204A-L is consonant with the example given above in the scaling factor description. That is, ideally the base current of each HBT 204A-L should scale directly with the area A of the active region of interest, i.e., length L times width W, of the emitter of that HBT. The various lengths L, widths W and areas A are shown in FIG. 2 using subscripts to denote differing values. Grouping 200 may also include one or more structures, e.g., contact pads 224, for electrically communicating with the key terminals of each of HBTs 204A-L, here collector terminals 208A-L, emitter terminals 212A-L and base terminals 216A-L for testing and measuring the relevant parameter(s) of interest of the devices, in this case the base current, using, e.g., a tester such as test measurement unit (TMU) 220. In this case, TMU 220 is shown as being external to grouping 200, and indeed, the wafer, such as wafer 100 of FIG. 1, upon which the grouping is formed. In other embodiments, though, TMU 220 may be integrated into grouping 200 or otherwise onto the wafer. TMU 220 may be made in accordance with well-known designs. If TMU 220 is integrated onto a wafer, contact pads 224 may be replaced with hard-wired connections and switches. After the parameter(s) of interest have been measured for some or all of HBTs 204A-L, the measured values are then used to calculate a desired parameter scaling metric, e.g., in the manner described below.

Figure 3:
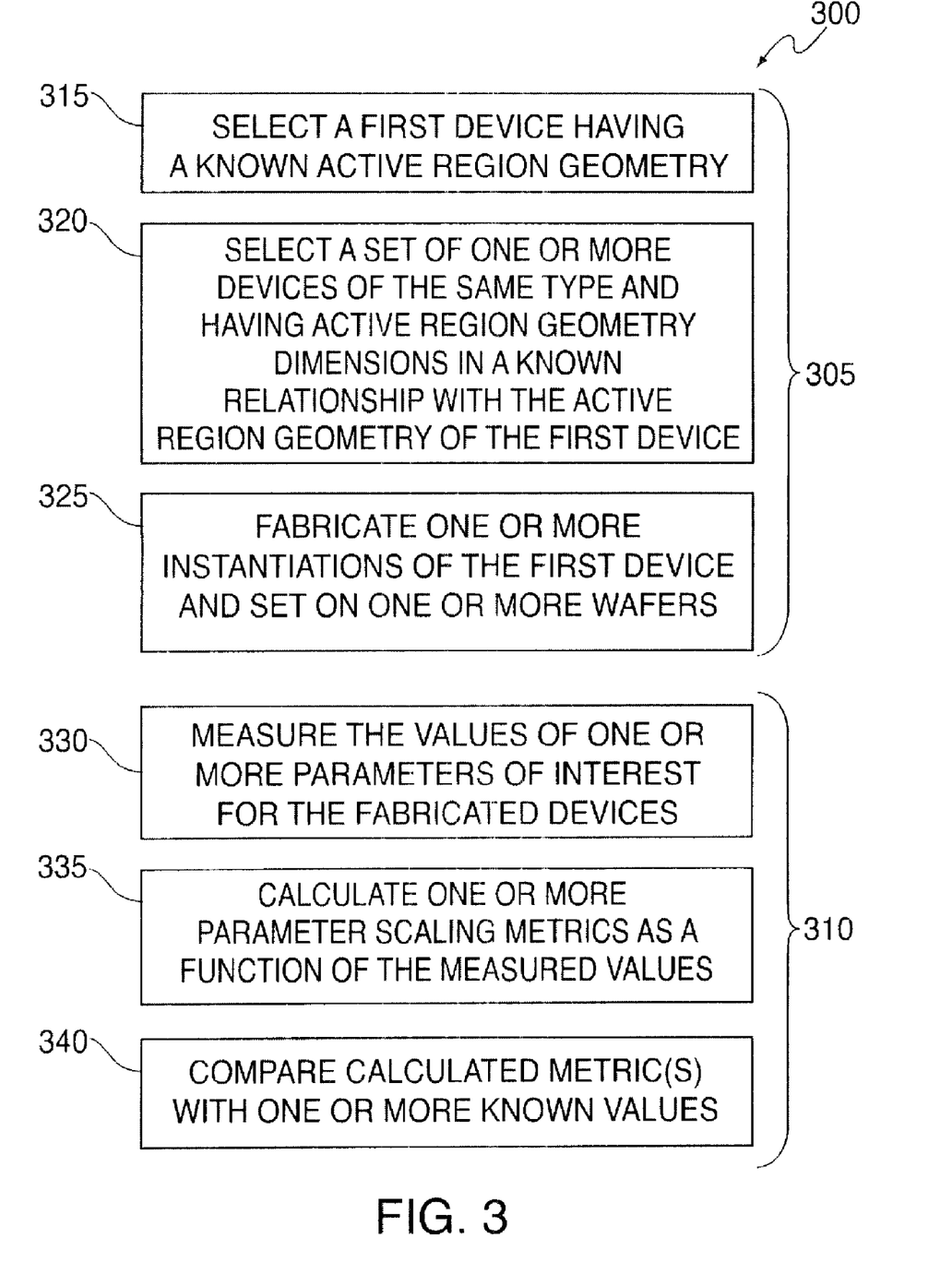
FIG. 3 is a flow diagram for a method of quantifying the uniformity and stability of a fabrication process using a scaling metric analysis.

FIG. 3 illustrates a method 300 for implementing a PSM analysis utilizing one or more PSM groupings, such as groupings 104 of FIG. 1 and grouping 200 of FIG. 2. Method 300 may be considered to have two primary parts, a group creation part 305 (comprising steps 315, 320, 325) for creating each grouping and a PSM analysis part 310 (comprising steps 330, 335, 340) for performing PSM analysis. As those skilled in the art will readily appreciate, parts 305, 310 may be considered separate methods in and of themselves, even though they are described herein as part of an overall method 300. For example, group creation part 305 may be implemented by one or more entities, e.g., designers and fabricators, that are distinct from one or more entities, e.g., testers and/or computers, that implement PSM analysis part 310. In addition, it is noted that PSM analysis part 310, and especially steps 335 and 340 may be implemented in software, such as a standalone application or a module of a larger testing/analysis software package. Each of these parts is described in detail below.

In group creation part 305, step 315 may include selecting a first, e.g., "reference," device (such as HBT 204A of FIG. 2) having a known active region geometry. As described above, this first device will be of the desired type, such as, but not limited to, a bipolar, FET, resistor, capacitor or inductor device. Next, at step 320, a set of one or more devices (e.g., HBTs 204B-L of FIG. 2) of the same type as the first device is selected so that the geometry dimensions of the active region(s) of the device(s) of the set are in a known relationship with the geometry dimensions of the first device. The result of steps 315 and 320 is a grouping of devices that is, for convenience, referred to herein as a "PSM grouping," and that may be used for any one or more of groupings 104 of FIG. 1.

At step 325, one or more instantiation of the PSM grouping are fabricated on one or more wafers, e.g., during the fabrication of the active circuitries aboard the wafer(s). As illustrated in FIG. 1 relative to PSM groupings 104, these instantiations may be located where desired, such as within any one or more of die regions 108 (active circuitry region) or within one or more of kerf regions 112. It is noted that, if desired, each PSM grouping may be placed in a scalable parametric measurement macro or some other structure that allows for testing and measurement of values of the device parameter(s) of interest. The locating of each PSM grouping may be left to a designer. Considerations in locating PSM groupings may include topology of the surrounding circuitry, proximity to areas of localized heating, and die and wafer regions of historically higher process variation (eg. wafer edge) among others. As described above, the placement of the individual devices within each grouping is performed so that all of the devices are in proximity to one another.

After fabrication, steps 330, 335, 340 of PSM analysis part 310 may be performed. At step 330, a measured value of each target parameter is obtained for at least some, and usually all, of the devices in each PSM grouping. This may be accomplished using conventional measurement and testing techniques typically used for measuring the parameter(s) of interest. For example, in the context of HBTs 204A-L of FIG. 2, the parameter of interest is the base current, Ib. Then, for grouping 200, step 330 includes testing each HBT 204A-L and measuring Ib for each of the HBTs. Again, if the tester is external to the wafer, this testing may be accomplished using contact pads 224 and conventional test probes (not shown). If, on the other hand, the tester is onboard the wafer, testing may be accomplished by appropriate dedicated testing circuitry. Those skilled in the art are readily familiar with both external and onboard testers, such that they need not be described herein in further detail.

Once measured values of the parameter(s) of interest have been obtained in step 330, at step 335 one or more parameter scaling metrics may be calculated, e.g., for individual pairs of devices within a grouping, for subgroups of devices within a grouping, for an entire grouping, for individual pairs of devices across a plurality of groupings on a single wafer or region of the wafer, for subgroups of devices across a plurality of groupings on a single wafer or region of the wafer, for a plurality of entire groupings across a wafer or region of the wafer, for individual pairs of devices across a plurality of groupings across a plurality of wafers, for subgroups of devices across a plurality of groupings across a plurality of wafers, for a plurality of entire groupings across a plurality of wafers, as desired. Examples of various parameter scaling metrics that may be calculated are described below. Typically, though not necessarily, this step of calculating one or more scaling metrics is performed on a machine, e.g., a computer, such as a personal computer, workstation, laptop, mainframe, automated testing equipment, etc. and results are displayed to a user. Exemplary tables displayed by such software are described below in connection with FIGS. 4 and 5.

In the general case, the parameter scaling factor can be expressed as:

$$X_{scaling} = X_i / X_j \quad \{3\}$$

where Xi is the measured value of the parameter for a first device i and Xj is the measured value of the parameter for a second device j. In addition to each device in a PSM grouping having a measured value (e.g., Xi and Xj in Equation 3, above) for a particular parameter, each device also has an expected value for that parameter. This expected value for a parameter may be expressed as a function of one or more geometry variable, e.g., length, width, area, perimeter, number of fingers, number of layers, number of turns, number of sides, height, distance, and/or thickness, etc., that describes the device's active region. That is, $$F = f\{geom_1, geom_2, \ldots, geom_n\} \quad \{4\}$$

where F is the expected value, $geom_1$, $geom_2$, ..., $geom_n$ are each a geometry variable and $f$ is the function. Using the measured values of Equation 3 and the expected values of Equation 4, one basic parameter scaling metric that may be calculated for a pair of devices is the difference between the measured and expected scaling factors, i.e., $$\Delta scaling = \frac{X_i}{X_j} - \frac{F_i}{F_j} \quad \{5\}$$

where $\Delta scaling$ is the scaling factor difference of a parameter of interest for a pair of devices, Xi and Fi are, respectively, the measured and expected values of the parameter for a first device i and Xj and Fj are, respectively, the measured and expected values of the parameter for a second device j. Another basic scaling metric for a pair of devices is a percentage difference between the measured and expected scaling factors, which may be expressed as:

$$\text{Percent } \Delta scaling = \frac{\left(\frac{X_i}{X_j} - \frac{F_i}{F_j}\right)}{\frac{X_i}{X_j}} * 100 = \left\{1 - \frac{F_i}{F_j} * \frac{X_j}{X_i}\right\} * 100 \quad \{6\}$$

where Percent $\Delta scaling$ is the percentage scaling factor difference and Xi, Fi, Xj and Fj are as defined above for Equation 5. Statistics may be calculated for these basic scaling metrics, such as the mean M and the sample standard deviation S:

$$M = \frac{\sum_{i=1}^{N} Z_i}{N} = \overline{Z} \quad \{7\}$$

$$S = \sqrt{\frac{\sum_{i=1}^{N}(Z_i - \overline{Z})^2}{N-1}} \quad \{8\}$$

where Zi is the sample value for a parameter scaling metric including a basic parameter scaling metric, eg. for the parameter scaling factor Xscaling defined above for Equation 3, or for the scaling factor difference $\Delta scaling$ defined in Equation 5, or for the percentage scaling factor difference Percent $\Delta scaling$ defined in Equation 6, and N is the number of sample values of Z.

Following are two examples of these basic parameter scaling metrics applied, respectively to two parameters of a bipolar junction transistor (BJT), in particular, a base current $I_B$ and a collector current $I_C$. In the first example, the base current $I_B$ is expected to have only an area component, i.e., $I_B = I_{BA} \times A_{emitter}$, where $I_{BA}$ is a base current per unit area and $A_{emitter}$ is the cross-sectional area of the emitter perpendicular to the current flow. Therefore, for two selected BJTs, the base current scaling factor difference and the percentage base current scaling factor difference metrics as per Equations 5 and 6, above, can be written as follows for base current $I_B$:

$$\Delta scaling \; I_B = \frac{I_{B1}}{I_{B2}} - \frac{A_{emitter1}}{A_{emitter2}} \quad \{9\}$$

and $$\text{Percent } \Delta scaling \; I_B = \left\{ 1 - \frac{A_{emitter1}}{A_{emitter2}} * \frac{I_{B1}}{I_{B2}} \right\} * 100 \quad \{10\}$$

where $I_{B1}$ and $I_{B2}$ are, respectively, the measured values of the base current for a first BJT and a second BJT, and $A_{emitter1}$ and $A_{emitter2}$ are, respectively, the emitter areas of the first and second BJTs. Similarly, the statistic parameter scaling metrics of Equations 7 and 8 may be expressed for the base current scaling factor $$\left( \frac{I_{B1}}{I_{B2}} \right)$$

as follows for this base current example:

$$M = \frac{\sum_{i=1}^{N} \left( \frac{I_{B1}}{I_{B2}} \right)_i}{N} \quad \{11\}$$

and $$S = \sqrt{\frac{\sum_{i=1}^{N} \left( \left( \frac{I_{B1}}{I_{B2}} \right)_i - \overline{\frac{I_{B1}}{I_{B2}}} \right)^2}{N-1}} \quad \{12\}$$

where $I_{B1}$ and $I_{B2}$ are, respectively, the measured values of the base current for the first and second BJTs and N is the number of instances of the first and second BJTs tested (and so the number of sample values calculated) across a plurality of groupings and/or across a plurality of wafers.

In the second example, the collector current $I_C$ is expected to have both perimeter and area components, i.e., $I_C = I_{CP} \times P_{emitter} + I_{CA} \times A_{emitter}$ where $I_{CP}$ is a collector current per unit length of perimeter, $P_{emitter}$ is the length of the emitter perimeter, $I_{CA}$ is a collector current per unit area, and $A_{emitter}$ is the cross-sectional area of the emitter perpendicular to the current flow. Therefore, for two selected BJTs, the collector current scaling factor difference and the percentage collector current scaling factor difference metrics as per Equations 5 and 6, above, can be written as follows for collector current $I_C$:

$$\Delta scaling \; I_C = \frac{I_{C1}}{I_{C2}} - \frac{I_{CP} * P_{emitter1} + I_{CA} * A_{emitter1}}{I_{CP} * P_{emitter2} + I_{CA} * A_{emitter2}} \quad \{13\}$$

and $$\text{Percent } \Delta scaling \; I_C = \left\{ 1 - \frac{P_{emitter1} + \frac{I_{CA}}{I_{CP}} * A_{emitter1}}{P_{emitter2} + \frac{I_{CA}}{I_{CP}} * A_{emitter2}} * \frac{I_{C2}}{I_{C1}} \right\} * 100 \quad \{14\}$$

where $I_{C1}$ and $I_{C2}$ are, respectively, the measured values of the collector current for a first BJT and a second BJT, $A_{emitter1}$ and $A_{emitter2}$ are, respectively, the emitter areas of the first and second BJTs and $P_{emitter1}$ and $P_{emitter2}$ are, respectively, the emitter perimeters of the two BJTs. Similarly, the statistic parameter scaling metrics of Equations 7 and 8 may be expressed for the percentage collector current scaling factor difference Percent $\Delta$scaling Ic as follows for this collector current example:

$$M = \frac{\sum_{i=1}^{N} (Percent \Delta scaling \; I_C)_i}{N} \quad \{15\}$$

and $$S = \sqrt{\frac{\sum_{i=1}^{N} \left( (Percent \; \Delta scaling \; I_C)_i - \overline{Percent \; \Delta scaling \; I_C} \right)^2}{N-1}} \quad \{16\}$$

where Percent $\Delta$scaling $I_C$, is defined in Equation 14 and N is the number of sample values of Percent $\Delta$scaling $I_C$ calculated across a plurality of groupings and/or across a plurality of wafers.

In the above cases, the mean M and standard deviation S have been described for a basic parameter scaling metric that describes the relationship of a particular pair of devices i, j from each PSM grouping, wherein each of these devices has the same geometry dimensions across the plurality of PSM groupings.

While the foregoing basic parameter scaling metrics applied to a pair of devices in a PSM grouping have certain usefulness, other parameter scaling metrics that combine information for more than two geometries have been found to provide more useful results in particular circumstances. Following are some of the more complex parameter scaling metrics that may be calculated. For example, it may be desirable in some circumstances to calculate the percentage scaling factor difference of the individual devices in a PSM grouping with respect to each of the other devices in the grouping. In other words, for a grouping having n devices, Equation 6 above is applied for each paired combination of devices in that grouping, i=1, 2, 3, . . . , n–1 and j=i+1, i+2, i+3, . . . , n. Then, a mean and standard deviation of the percentage scaling factor difference values of the grouping are calculated. After that, if desired, a mean and standard deviation of the means and/or the mean of the standard deviations across all of the PSM groupings under consideration may be calculated. The PSM groupings included in this statistical parameter scaling metric analysis may be located in a particular region of a wafer, across an entire wafer or across a plurality of wafers, such as a lot of wafers, as desired. Those skilled in the art will readily appreciate that other statistical metrics may be calculated in lieu of or in addition to the mean and standard deviation at the option of the designer of a particular analysis.

In a variation of the immediately previous set of parameter scaling metrics, essentially the same statistics can be applied for the grouping and across a plurality of groupings, but with the percentage scaling factor difference of the individual devices in a PSM grouping being determined with respect to a single reference device within that grouping. That is, in terms of Equation 6 and with the total number of devices in the PSM grouping being n, i=1, 2, 3, . . . , n−1 and j is a single reference device. Then, as above, a mean and standard deviation of the percentage scaling factor difference values of the grouping are calculated. After that, if desired, a mean and standard deviation of the means and/or the mean of the standard deviations across all of the PSM groupings under consideration may be calculated. Again, the PSM groupings included in this statistical parameter scaling metric analysis may be located in a particular region of a wafer, across an entire wafer or across a plurality of wafers, such as a lot of wafers, as desired. Those skilled in the art will readily appreciate that other statistical metrics may be calculated in lieu of or in addition to the mean and standard deviation at the option of the designer of a particular analysis.

Another set of parameter scaling metrics produces a single value for the grouping and uses a sign-independent base metric (i.e., a base metric wherein the sign of the individual values does not influence the metric), such as a sum of absolute values raised to a positive power, a sum of squares or other even power, etc. of, e.g., a scaling factor difference or a percentage scaling factor difference as described above in connection with Equations 5 and 6. In this example, the parameter scaling metric involves a sum of the absolute values raised to the power m of the fractional scaling factor differences between a reference device and each of the non-reference devices in a PSM grouping, where the fractional scaling factor difference is the percentage scaling factor difference divided by 100, ie. Percent Δscaling/100. In terms of Equation 6 and given a PSM grouping with n devices including the reference device, where m is a positive number, j is now a single reference device ref and i=1, 2, 3, . . . , n−1, the sum of the absolute values raised to the power m of the fractional scaling factor differences is obtained for a PSM grouping, i.e., $$\sum_{i=1}^{n-1} \left| \left\{ 1 - \frac{F_i}{F_{ref}} * \frac{X_{ref}}{X_i} \right\} \right|^m \quad \{17\}$$

A sum of absolute values raised to the power m of the fractional scaling factor differences is calculated for each of a plurality of PSM groupings, which may be within a particular region of a wafer, distributed across a wafer and/or distributed across a plurality of wafers. Then, once these sums have been calculated, it may be desirable to calculate one or more statistical metrics across these sums, such as a mean and standard deviation. Other statistical metrics may alternatively or additionally be calculated.

In a variation on the immediately preceding set of parameter scaling metrics, instead of the sign-independent sum for a PSM grouping being of scaling factor differences or percentage scaling factor differences or fractional scaling factor differences relative to a reference device only, the sum may also include a sum of scaling factor differences or percentage scaling factor differences or fractional scaling factor differences relative to user-designated comparison-geometry devices. For example, building on the foregoing example which is relative to a reference device only, the sum calculated above would also include a sum of the absolute values raised to the power m of the fractional scaling factor differences relative to a designated comparison-geometry device comp, where comp may be unique for each i, and where i, m and n are defined as above, i.e., the total sum for a grouping would be:

$$\sum_{i=1}^{n-1} \left| \left\{ 1 - \frac{F_i}{F_{ref}} * \frac{X_{ref}}{X_i} \right\} \right|^m + \left| \left\{ 1 - \frac{F_i}{F_{comp}} * \frac{X_{comp}}{X_i} \right\} \right|^m \quad \{18\}$$

As above, a sum of absolute values raised to the power m of the fractional scaling factor differences is calculated for each of a plurality of PSM groupings, which may be within a particular region of a wafer, distributed across a wafer and/or distributed across a plurality of wafers. Then, once these sums have been calculated, it may be desirable to calculate one or more statistical metrics across these sums, such as a mean and standard deviation. Other statistical metrics may alternatively or additionally be calculated.

Once the parameter scaling metric(s) of interest has/have been calculated, at step 340 each calculated metric may be compared with a known value, e.g., to determine whether or not a particular process is yielding an acceptable variation. Each known value may be, e.g., a value calculated from a control group, a target value determined, e.g., from historical data, or an ideal value determined, e.g., by calculations based on theoretical relationships and incorporating process parameters and the known variation of these parameters. The results of comparing each calculated metric with a known value may then be used in making decisions about a process. For instance, if the mean or standard deviation of the base current scaling metrics for one or more wafers in an experimental process lot exceeds that of the control group wafers, engineering action may be taken to alter the experimental process, until the base current scaling metrics and statistics of the resultant experimental wafers are equivalent or superior to those of the control group wafers.

As mentioned above, various functions of a method of performing a parameter scaling analysis, such as method 300 of FIG. 3, can be implemented in software that can be stored on any suitable machine-readable memories, including electronic storage media (such as RAMs, ROMs, flash memories, etc.), optical storage media (such as CDs, DVDs, BDs (i.e., Blu-Ray disks), holographic disks, etc.), magnetic storage media (hard disks, floppy disks, tapes, etc.), among others.

Figure 4:
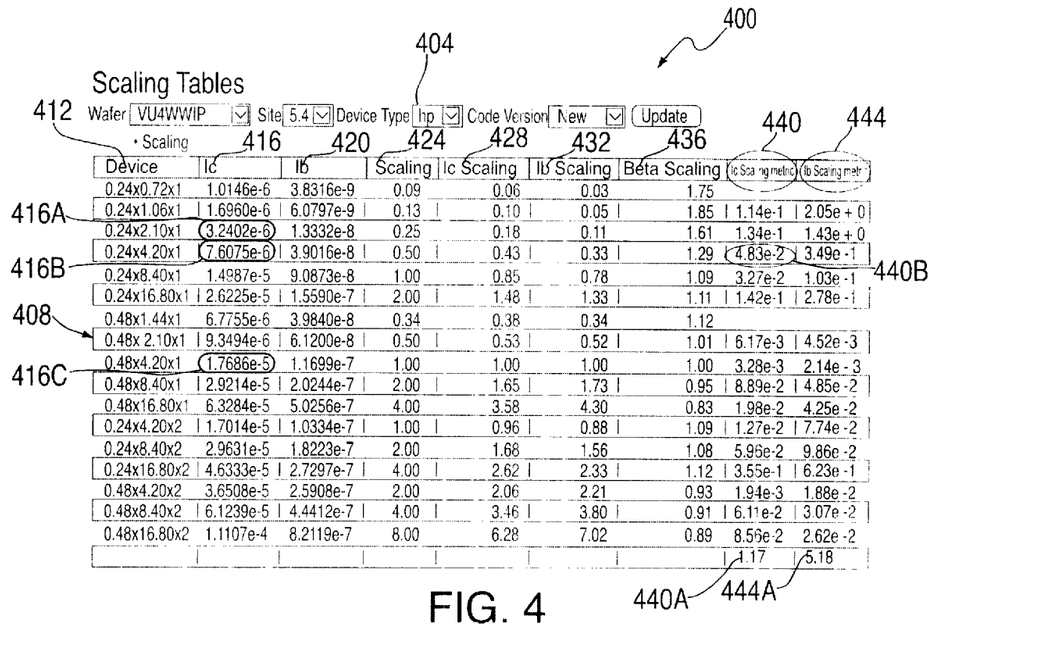
FIG. 4 is a screenshot of a graphical user interface showing a scaling table for a scaling metric analysis of a grouping of devices on a wafer having a relatively high process variation.
Figure 5:
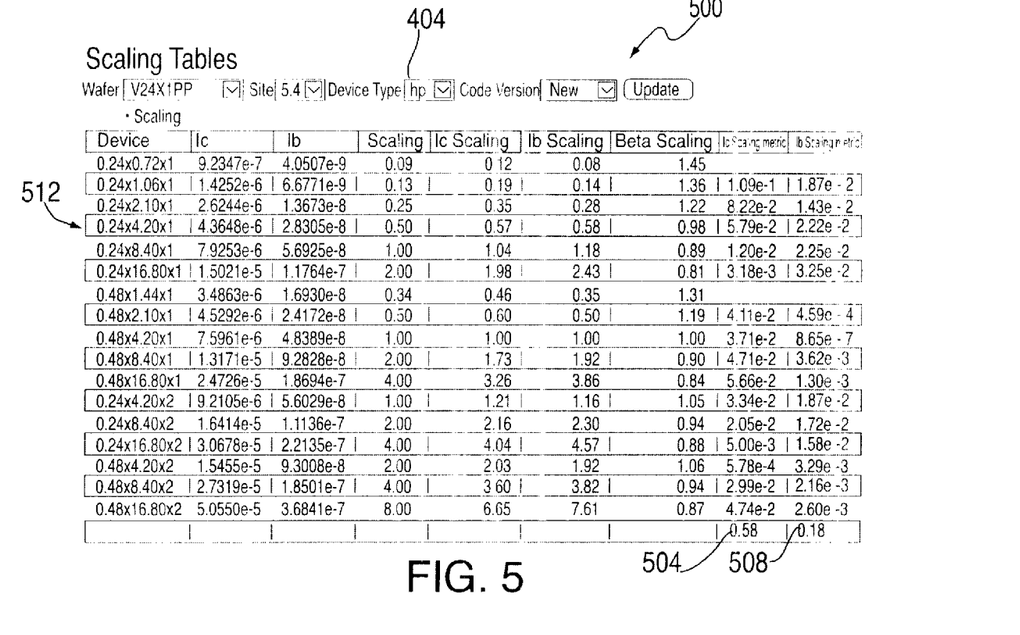
FIG. 5 is a screenshot of a graphical user interface showing a scaling table for a scaling metric analysis of a grouping of devices on a wafer having a relatively low process variation.

FIGS. 4 and 5 each contain a corresponding respective screenshot 400, 500 of a graphical user interface (GUI) 404 of an example of such software as these screenshots are visually presented to a user on a display. As those skilled in the art will readily appreciate, GUI 404 may be implemented in any of a wide variety of ways, depending on the type of environment in which the software is designed to be run. Since the various environments and way of implementing GUIs, such as GUI 404, in these environments are well known, it is not necessary to provide any examples herein for skilled artisans to appreciate the broad scope of the present disclosure.

Screenshot 400 of FIG. 4 illustrates an exemplary scaling table 408 for a PSM grouping containing seventeen BJTs (not shown) having varying active region geometries. These geometries are depicted in a first column 412 of scaling table 408 using the form "width (um)×length (um)×number of fingers." Scaling table 408 also includes second and third columns 416, 420 that show, respectively, the measured collector current Ic and the measured base current Ib in Amps for the corresponding device identified in first column 412. The fourth column 424 identifies the expected geometric scaling factor for each of the BJTs relative to a reference BJT, which in this case is the "0.48×4.20×1" BJT. The fifth and sixth columns 428, 432 contain the calculated scaling factors for Ic and Ib, respectively, for each of the BJTs relative to the reference BJT, as calculated using Equation 1, above. The seventh column 436 shows a calculated beta scaling factor for each of the BJTs relative to the reference BJT. As is well known, beta is the ratio of a BJT's collector current to its base current, indicating the amount of DC current gain that the transistor can provide. The eighth and ninth columns 440, 444 contain, respectively, calculated parameter scaling metrics for, respectively, Ic and Ib, as well as corresponding respective sums 440A, 444A of these metrics for the grouping.

In this example, the parameter scaling metric used is one of the sign-independent metrics described above in connection with Equation 18 that utilizes a sum of the squares (m=2) of the fractional scaling factor differences with respect to each of a reference BJT and a selected comparison BJT. In this example, the selected comparison BJT for a given target BJT is the next shorter BJT having the same width as the target BJT. As can be readily seen in eighth and ninth columns 440, 444, this selection of comparison BJTs results in there not being any parameter scaling metric values for each of the "0.24×0.72×1" and "0.48×1.44×1" BJTs since there are no BJTs of the same width having shorter lengths.

A calculation of this parameter scaling metric is illustrated below for the "0.24×4.20×1" BJT for Ic using the base sign-independent metric, $(1-(A_i/A_{ref})*(Ic_{ref}/Ic_i))^2+(1-(A_i/A_{comp})*(Ic_{comp}/Ic_i))^2$, where A is the cross-sectional area of the emitter perpendicular to the current flow and is calculated here as width×length×number of fingers. In this example, as mentioned above, the target device (i=4, the fourth device in first column 412) is the "0.24×4.20×1" BJT, the reference device (ref=9, the ninth device in first column 412) is the "0.48×4.20×1" BJT and the selected comparison device (comp=3, the third device in first column 412) is the "0.24×2.1×1" BJT. Using the appropriate values for the measured collector current Ic, i.e., values 416A-C of second column 416, in the foregoing base metric and multiplying each of the Ic values by $10^6$ for convenience, the resulting value is $(1-(1/2)*(17.686/7.6075))^2+(1-(1/0.5)*(3.2402/7.6075))^2 = 0.0483$, which corresponds to the metric value 440B of eighth column 440. As seen by the relatively high magnitude of parameter scaling metric sums 440A, 444A, and especially comparing them to the corresponding respective sums 504, 508 of scaling table 512 of FIG. 5, the PSM grouping of scaling table 408 indicates that the process variation during fabrication of the BJTs of this PSM grouping was relatively high. Conversely, the relatively low magnitude of parameter scaling metric sums 504, 508 of scaling table 512 of FIG. 5 indicate that the process variation during the fabrication of the BJTs in the corresponding PSM grouping reflected in that table was relatively low.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A method of measuring variation in a manufacturing process, comprising:
   providing at least one grouping of devices on at least one semiconductor article, each of said at least one grouping including:
      a first device having a known active region geometry and at least one first key terminal; and
      a set of one or more second devices each having active region geometry dimensions in a known relationship with said known active region geometry of said first device and including at least one second key terminal;
   measuring an active region parameter for each of said first device and said one or more second devices in each of said at least one grouping of devices;
   calculating a parameter sealing metric for each grouping of said at least one grouping; and
   using said parameter scaling metric to measure variation in the manufacturing process.

2. The method of claim 1, wherein the step of using said parameter scaling metric comprises comparing each said parameter scaling metric with one or more of the following:
   a) a control grouping;
   b) a target; and
   c) an ideal value.

3. The method of claim 1, further comprising displaying said parameter scaling metric to a user on an electronic display.

4. The method of claim 1, wherein said calculating of said parameter scaling metric includes calculating a difference between a measured scaling ratio and an expected scaling ratio.

5. The method of claim 1, wherein said providing of said at least one grouping includes providing a plurality of groupings spaced from one another, said calculating of said parameter scaling metric including calculating at least one parameter sealing statistic for a single device geometry pair across said plurality of groupings.

6. The method of claim 1, wherein said calculating of said parameter scaling metric includes calculating at least one first parameter scaling statistic for a measured-versus-expected difference measure for each of said devices against each other of said devices.

7. The method of claim 6, wherein said providing of said at least one grouping includes providing a plurality of groupings spaced from one another, said calculating of said parameter scaling metric including:
   calculating a plurality of first parameter scaling statistics corresponding respectively to said plurality of groupings; and
   calculating at least one second parameter scaling statistic as a function of said plurality of first parameter scaling statistics.

8. The method of claim 1, wherein said calculating of said parameter scaling metric includes calculating at least one first parameter scaling statistic for a measured-versus-expected difference measure for each of said devices against a reference one of said devices.

9. The method of claim 8, wherein said providing of said at least one grouping includes providing a plurality of groupings spaced from one another, said calculating of said parameter scaling metric including:
   calculating a plurality of first parameter scaling statistics corresponding respectively to said plurality of groupings; and calculating at least one second parameter scaling statistic as a function of said plurality of first parameter scaling statistics.

10. The method of claim 1, wherein said calculating of said parameter scaling metric includes calculating a sum for a sign-independent measured-versus-expected difference measure for each of said devices against a reference one of said devices.

11. The method of claim 10, wherein said providing of said at least one grouping includes providing a plurality of groupings spaced from one another, said calculating of said parameter scaling metric including:
 calculating a plurality of sums corresponding respectively to said plurality of groupings; and
 calculating at least one parameter scaling statistic as a function of said plurality of sums.

12. The method of claim 1, wherein said calculating of said parameter scaling metric includes calculating a sum for a sign-independent measured-versus-expected difference measure for each of said devices against a reference one of said devices and each of said devices against a designated comparison device.

13. The method of claim 12, wherein said providing of said at least one grouping includes providing a plurality of groupings spaced from one another, said calculating of said parameter scaling metric including:
 calculating a plurality of sums corresponding respectively to said plurality of groupings; and
 calculating at least one parameter scaling statistic as a function of said plurality of sums.

14. A semiconductor wafer, comprising:
 a plurality of layers,
 at least one parameter scaling metric grouping of devices formed amongst said plurality of layers, each of said at least one parameter scaling metric grouping including:
  a first device having a known active region geometry and at least one first key terminal; and
  a set of one or more second devices each having active region geometry dimensions in a known relationship with said known active region geometry of said first device and including at least one second key terminal;
 circuitry for contacting corresponding respective ones of said at least one first key terminal and said at least one second key terminal to measure an active region parameter for each one of said first device and said one or more second devices.

15. The semiconductor wafer of claim 14, further comprising a plurality of die regions and a plurality of kerf regions interdigitated with said plurality of die regions, said at least one parameter scaling metric grouping located within said plurality of kerf regions.

16. The semiconductor wafer of claim 14, further comprising a die region, said at least one scaling metric grouping located within said die region.

17. The semiconductor wafer of claim 16, comprising a plurality of parameter scaling metric groupings spaced from one another within said die region.

18. A machine readable medium storing computer executable instructions for monitoring variation in a process of a semiconductor device using parameter measurement data acquired from at least one parameter scaling metric grouping of fabricated semiconductor devices, wherein the grouping includes a first device having a known active region geometry and further includes a set of one or more second devices each having active region geometry dimensions in a known relationship with the known active region geometry of the first device, the computer executable instructions comprising:
 a first set of machine executable instructions for receiving parameter measurement data for the fabricated semiconductor devices in the at least one grouping;
 a second set of machine executable instructions that calculates at least one parameter scaling metric for each grouping of the at least one grouping as a function of said parameter measurement data; and
 a third set of machine executable instructions for displaying said at least one parameter scaling metric to a user.

19. The machine readable medium of claim 18, wherein said second set of machine executable instructions includes machine executable instructions for calculating a plurality of parameter scaling metric statistics as a function of said parameter measurement data.

20. The machine readable medium of claim 18, wherein said second set of machine executable instructions includes machine executable instructions for calculating at least one sign-independent metric as a function of said parameter measurement data.

* * * * *